United States Patent

Wu et al.

[11] Patent Number: 5,960,959
[45] Date of Patent: Oct. 5, 1999

[54] WAFER RETAINING MECHANISM

[75] Inventors: Tzong-Ming Wu; Gwo-Jou Huang, both of Hsinchu, Taiwan

[73] Assignee: Industrial Technology Research Institute, Hsinchu, Taiwan

[21] Appl. No.: 09/017,121

[22] Filed: Jan. 13, 1998

[51] Int. Cl.⁶ .................................................. B65D 85/48
[52] U.S. Cl. ........................................ 206/710; 206/454
[58] Field of Search ................................. 206/710, 711, 206/722, 723, 454, 445; 414/217

[56] References Cited

U.S. PATENT DOCUMENTS

| | | | |
|---|---|---|---|
| 4,739,882 | 4/1988 | Parikh et al. | 206/454 |
| 4,815,912 | 3/1989 | Maney et al. | 414/217 |
| 4,886,169 | 12/1989 | Ayers et al. | 206/710 |
| 5,452,795 | 9/1995 | Gallagher et al. | 206/711 |
| 5,740,845 | 4/1998 | Bonora et al. | 206/710 |

*Primary Examiner*—Paul T. Sewell
*Assistant Examiner*—Luan K. Bui
*Attorney, Agent, or Firm*—W. Wayne Liauh

[57] ABSTRACT

Disclosed is an improved wafer retaining mechanism comprising a canopy, and more than one set of retaining mechanisms affixed to appropriate locations of the canopy, the retaining mechanism being operative in coordination with wafers received within a wafer cassette and a chassis for urging the wafers in place. The wafer retaining mechanisms each comprises a link unit including a sliding rod, a lower link, a front link, an upper link, and associated pins, wherein the link unit is featured with openings at respective pivots to serve as engaging sections which, in response to proper external forces, engage or disengage components of the link unit from respective pins so as to facilitate assembly or disassembly of the link unit.

11 Claims, 6 Drawing Sheets

WAFER RETAINING MECHANISM

FIELD OF THE INVENTION

The present invention relates to an improved wafer retaining mechanism, in particular to a wafer retaining mechanism featuring engaging sections provided on link units of the retaining mechanism so as to facilitate easy assembly and disassembly of the link unit.

BACKGROUND OF THE INVENTION

A patent application, entitled "Wafer Retaining Mechanism," filed by the same Applicant on Dec. 19, 1997, App. Ser. No. 08/994,982, now U.S. Pat. No. 5,890,597, relates to a wafer retaining mechanism comprising a link mechanism disposed at inside of a canopy for retaining and locating wafers. The link mechanism includes a base rod affixed to the canopy, a sliding rod movable within the base rod, a front link, and an upper and lower links pivoted on the sliding rod and the front link. When the canopy receives a wafer cassette, the sliding rod of the retaining mechanism urges against a chassis located at bottom of the wafer cassette subjecting the sliding rod to move upwards within the base rod for urging the lower link outwards, such that lower end of the front link is urged obliquely outwards in response to the action of the lower link. The upper link is activated to push the upper end of the front link by external forces when the sliding rod and the front link both urge against the chassis. The wafers are then urged to align in place when all links of the retaining mechanism are expanded.

The present invention is substantially similar to the structure of the above-mentioned application in respect to the wafer retaining mechanism. The features that distinguish the present invention from said application reside in that the link unit is featured with engaging sections at respective pivots, which the engaging sections, in response to proper external forces, engage or disengage components of the link unit so as to facilitate assembly or disassembly of the link unit.

SUMMARY OF THE INVENTION

It is thus a primary object of the present invention to provide an improved wafer retaining mechanism being provided with one or more link unit at an appropriate location inside a canopy. The link units are each featured with engaging sections at pivots so as to facilitate assembly or disassembly of the link units.

Generally speaking, the improved wafer retaining mechanism of the present invention comprises a canopy and one or more link unit disposed at an appropriate location inside the canopy. The link unit is operative in coordination with a wafer cassette, wafers received within the wafer cassette, and a chassis located at bottom of the wafer cassette, such that the link unit may urge the wafers in place when the canopy receives the wafer cassette. The link unit comprises a link unit including a sliding rod, a lower link, a front link, an upper link, and associated pins. The link unit is featured with engaging sections at locations corresponding to respective pivots, which engaging sections, in response to proper external forces, engage or disengage components of the link unit from respective pins so as to facilitate assembly or disassembly of the link unit.

BRIEF DESCRIPTION OF THE DRAWINGS

The structure and functions of the present invention are described in conjunction with the following drawings.

DESCRIPTIONS OF PREFERRED EMBODIMENTS OF THE INVENTION

Figure 1:
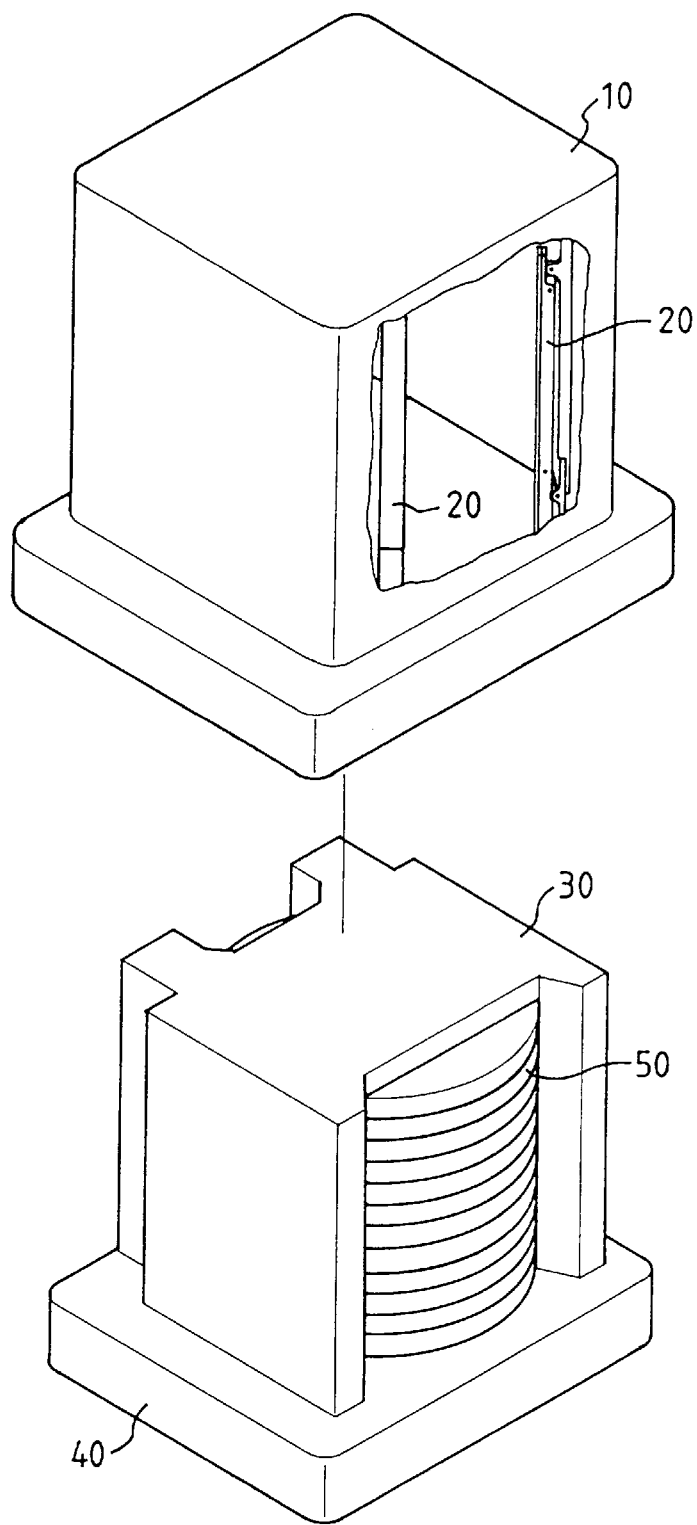
FIG. 1 is an exploded view illustrating a wafer retaining mechanism according to the present invention being assembled inside a canopy, in accompany with a wafer cassette, wafers, and a chassis.
Figure 2:
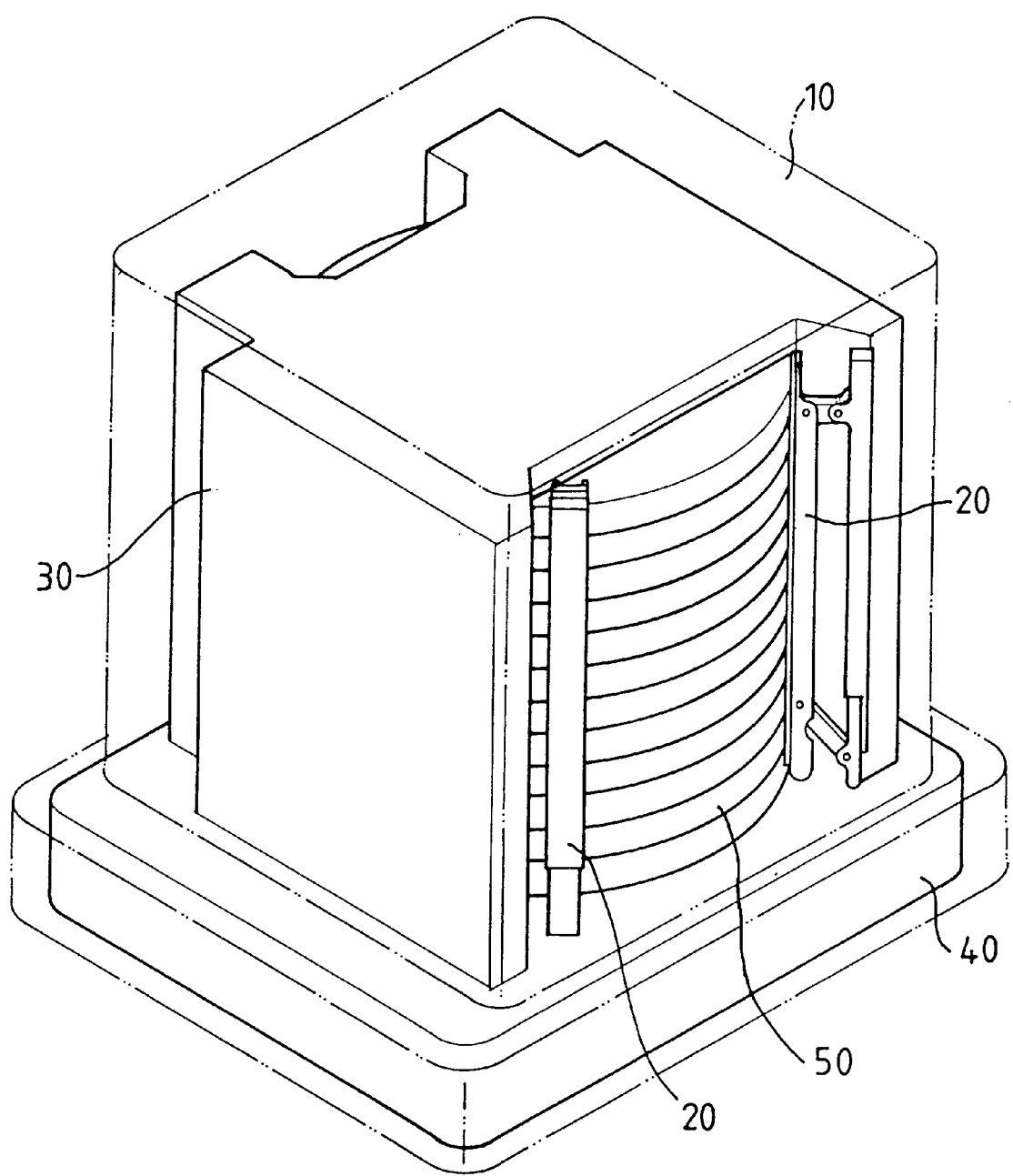
FIG. 2 is a schematic view illustrating the canopy covering a wafer cassette, wherein the retaining mechanism of the present invention urges against the chassis for pushing the wafers to align in place.

Now referring to FIGS. 1 and 2, an improved wafer retaining mechanism of the present invention comprises a canopy 10 and link units 20, wherein the canopy 10 is a hollow body formed with an opening at lower side thereof to cover a wafer cassette 30 for storing a plurality of wafers and the wafer cassette is affixed with a chassis 40 at bottom thereof. The link units 20 are disposed at appropriate locations inside the canopy 10. In this embodiment, two link units 20 are respectively disposed at two neighboring corners inside the canopy 10.

As shown in FIGS. 3A to 3D, the link units 20 each comprises a link unit including a sliding rod 26, a lower link 22, a front link 23, and an upper link 24; wherein the sliding rod 26 is slidably, telescopically provided on a base rod 21 affixed to the canopy 10, the left lower side of the sliding rod 26 being provided with a tongue 261 projecting outwards;

while the left upper side of the base rod 21 being provided with a tongue 262 projecting outwards. The tongues 262 and 261 are each formed with openings for respectively pivoting the upper link 24 and the lower link 22 by means of pins 281 and 283. The upper link 24 and the lower link 22 are pivotally connected with the front link 23 by means of pins 282 and 284, wherein the upper link 24 is formed with openings 241 and 242 at the pivots and the lower link 22 is formed with openings 221 and 222 at the pivots. Alternatively, the upper and lower links 24 and 22 can be pivoted directly on the canopy 10. In other words, tongues may be disposed on the canopy 10 for pivoting purpose.

To facilitate assembly or disassembly of components of the link units, the present invention is characterized by engaging sections formed at the pivots of the upper and lower links 24 and 22. The engaging sections relate to forming a notch 244 or 243 at one of pivotal openings 241 and 242, or at both pivotal openings 241 and 242 of the upper link 24, and a notch 224 or 223 at one of pivotal openings 221 and 222, or at both pivotal openings 221 and 222 of the lower link 22. The gaps of notches 244, 243, 224, and 223 must be smaller than openings 241, 242, 221, and 222, i.e., smaller than the axle diameters of pins 281, 282, 283, and 284 whereby components of the link unit are easily assembled or disassembled due to the flexibility of the upper and lower links 24 and 22 in response to proper external forces. A symmetrical relation is preferably maintained between the notches 244, 243 and 224, 223 of the upper and lower links such that assembly or disassembly operations may be conveniently accomplished by applying forces in identical directions. The upper and lower links 24 and 22 may be integrated with the associated pins 281, 282, 283 and 284.

In this embodiment, the sliding rod 26 is slidably received within the base rod 21, which is affixed inside the canopy 10. In practice, the sliding rod 26 may be movably disposed inside the canopy 10 by any measures. In this embodiment, the upper end 26a of the sliding rod 26 has a smaller diameter for receiving a spring 27, which urges against a limit portion 211 of the base rod 21. Therefore, the spring 27 constantly applies forces to the sliding rod 26 to urge the sliding rod 26 downwards subjecting the entire link unit to assume a retracted position.

Figure 3A:
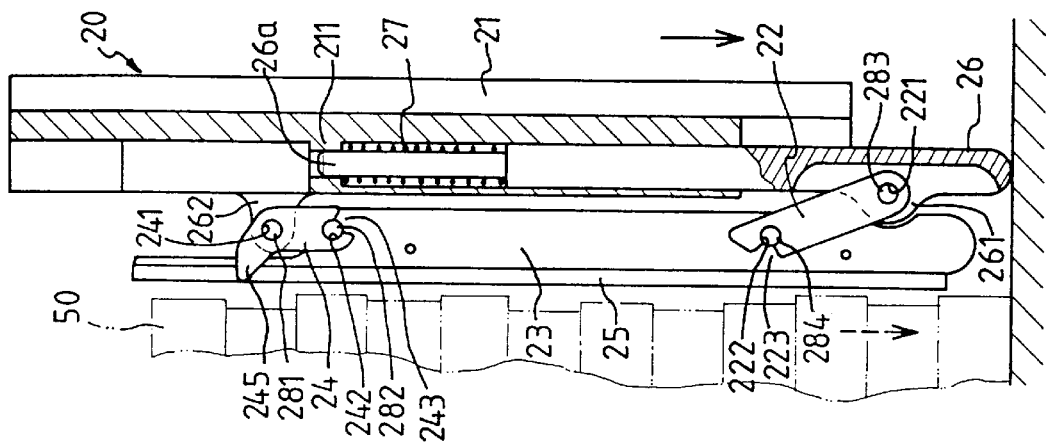
FIG. 3A is a schematic view illustrating operations of the retaining mechanism of the present invention such that a sliding rod of the retaining mechanism starts to urge against the chassis when the canopy receives the cassette.
Figure 3B:
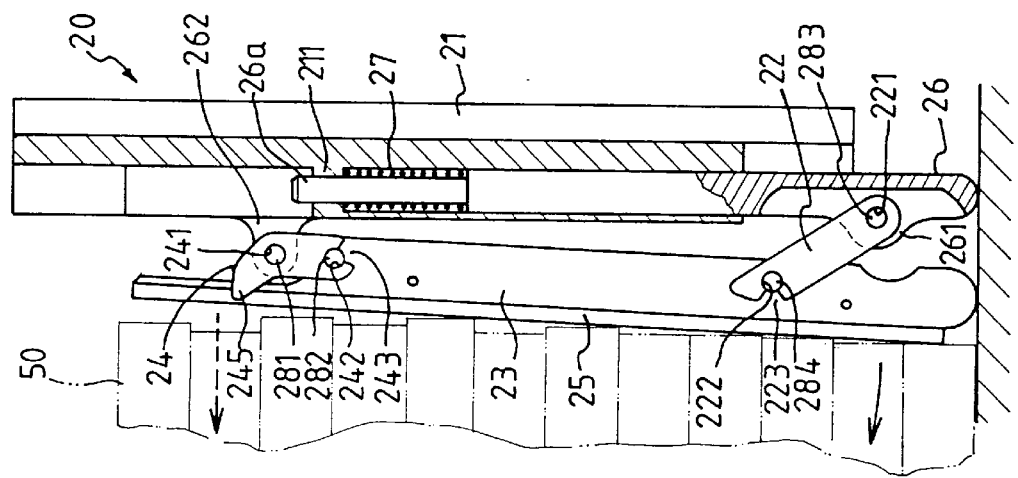
FIG. 3B is a schematic view illustrating operations of the retaining mechanism of the present invention such that the sliding rod pushes a lower link upwards and pushes a front link obliquely leftwards.
Figure 3C:
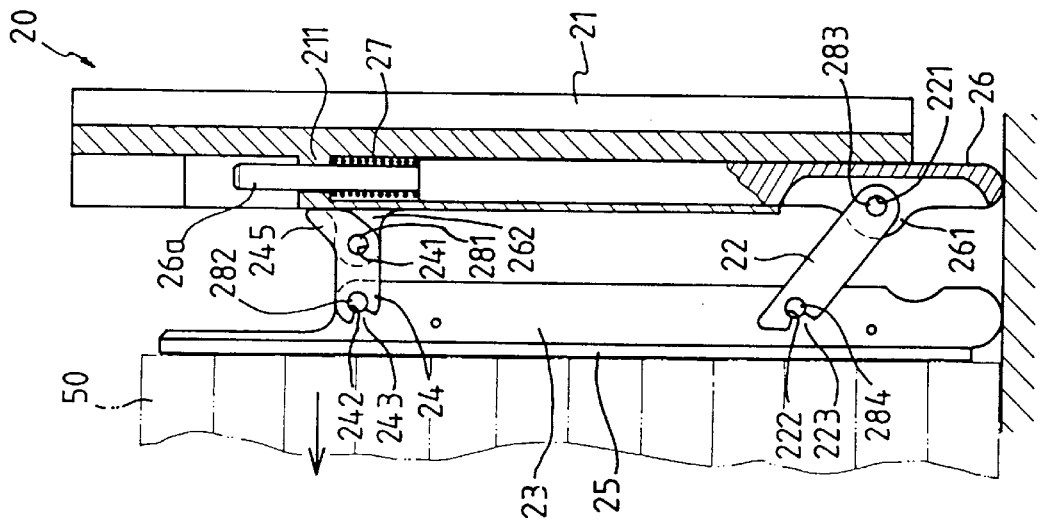
FIG. 3C is a schematic view illustrating operations of the retaining mechanism of the present invention such that the sliding rod and the front rod both urge against the chassis causing the front link to fully expand for urging the wafers to align in place, wherein front ends of the upper and lower links are each featured with engaging sections.
Figure 3D:
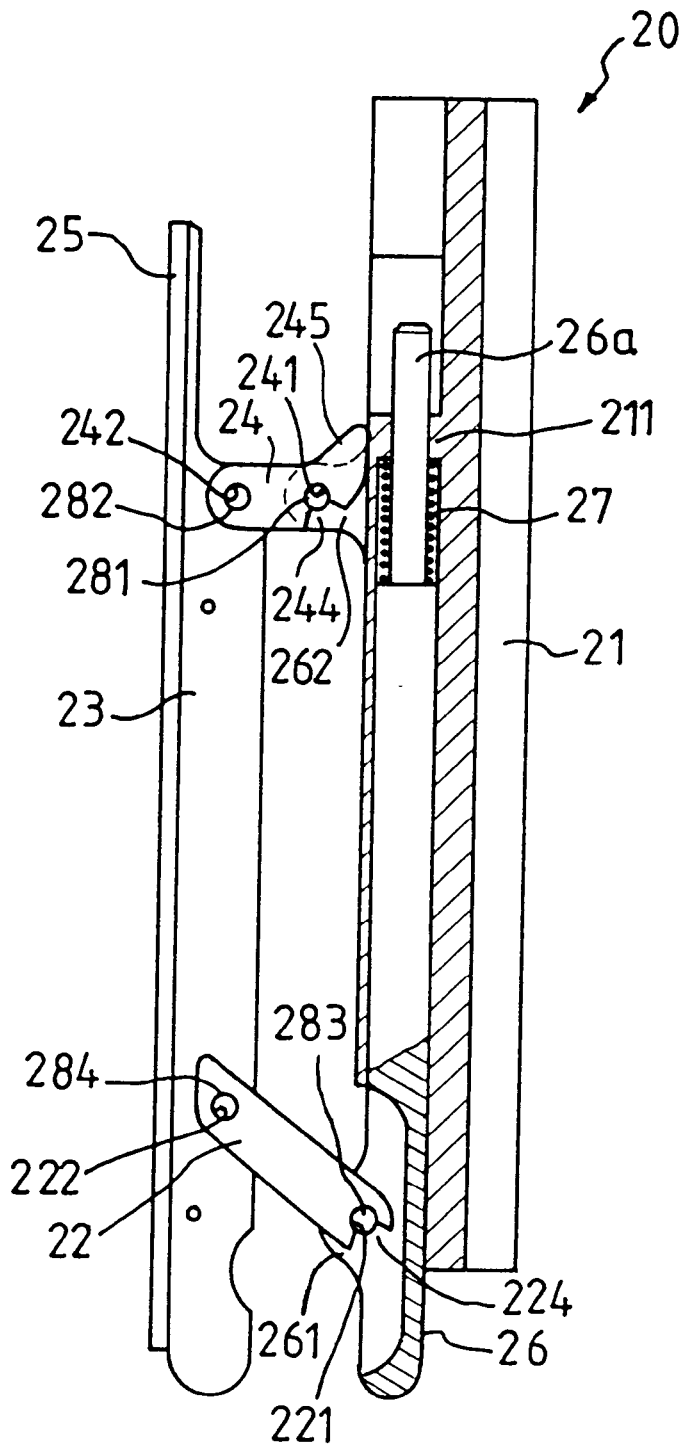
FIG. 3D is a schematic view illustrating operations of the retaining mechanism of the present invention such that the front link is fully expanded, except that rear ends of the upper and lower links are respectively featured with engaging sections.

When the canopy 10 receives the wafer cassette 30, the sliding rod 26 of the link unit 20 undertakes contact with the chassis 40 (as shown in FIG. 3A). The sliding rod 26 is then forced to move upwards subjecting the lower link 22 to move obliquely leftwards and upwards thereby causing the lower end of the front link 23 to move obliquely leftwards and upwards (as shown in FIG. 3B). When both the sliding rod 26 and the lower link 22 urge against the chassis 40, the upper end of the front link 23 pivots about the upper link 24 to assume a fully expanded position so as to urge the wafers 50 stored within the wafer cassette 30 to align in place.

Furthermore, the front link 23 may be equipped with a disposable liner 25 at frontage thereof so as to facilitate replacement of contaminated liners resulted from multiple contacts with the wafers to constantly maintain an uncontaminated contact. The upper link 24 may further be mounted with an urging plate 245 undertaking an appropriate angle for urging against the base rod 21 when the front link 23 is fully expanded so as to facilitate the front link 23 urging against the wafers 50.

Figure 4:
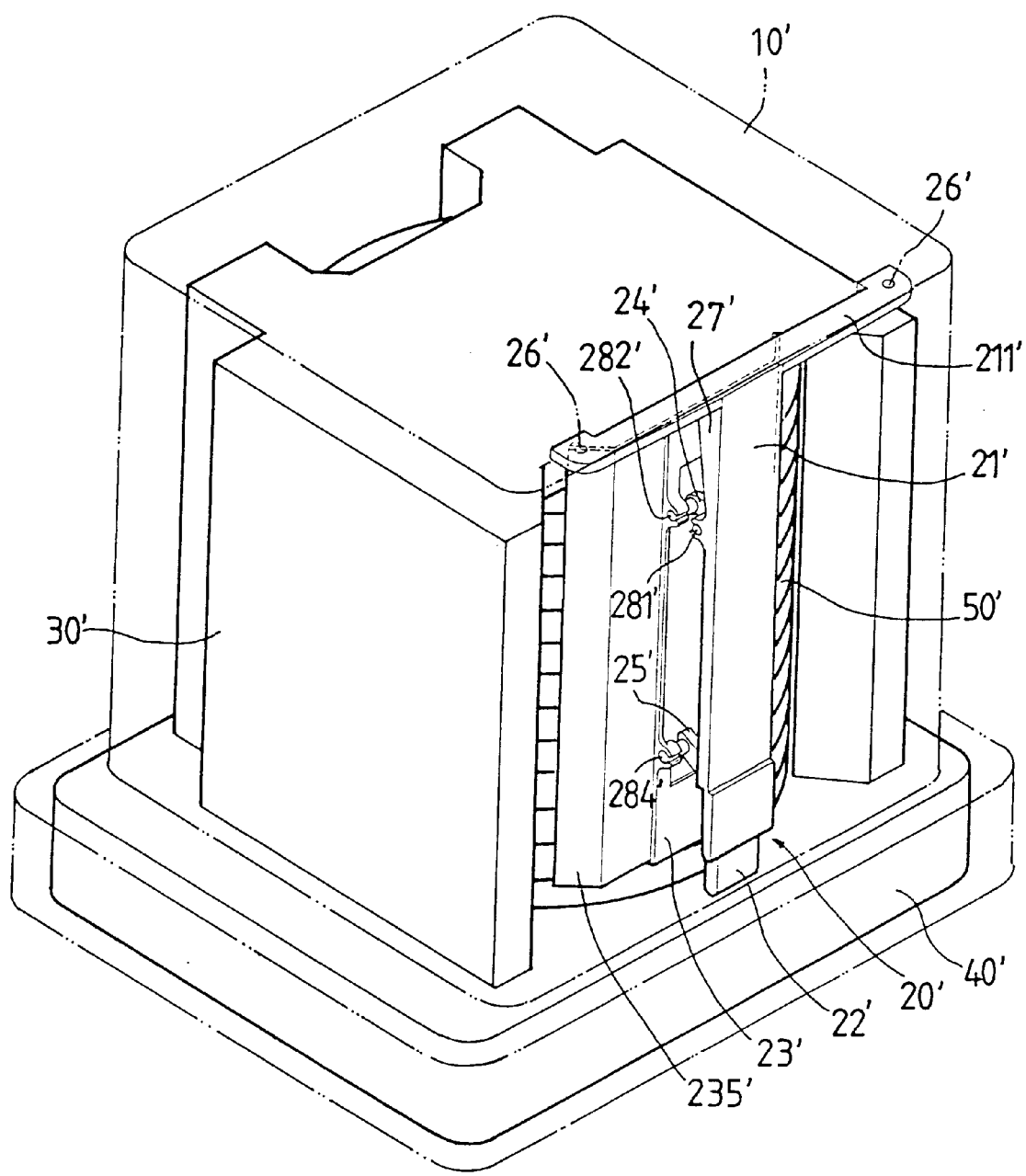
FIG. 4 is a schematic view illustrating another embodiment of the wafer retaining mechanism according to the present invention, wherein the retaining mechanism urges against the chassis for pushing the wafers to align in place.
Figure 5A:
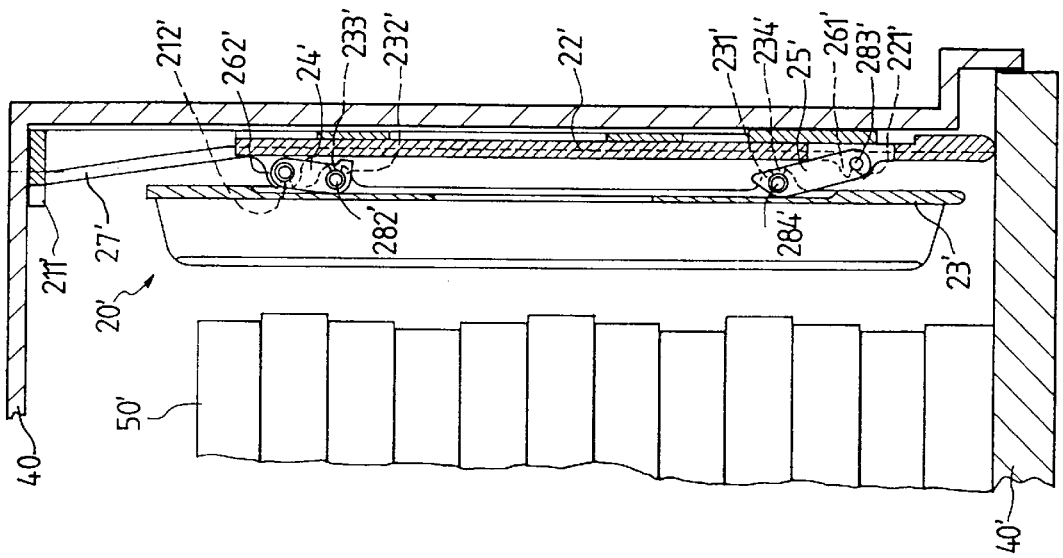
FIG. 5A is a schematic view illustrating operations of the retaining mechanism according to another embodiment of the present invention, such that the sliding rod of the retaining mechanism starts to urge against the chassis when the canopy receives the cassette.
Figure 5B:
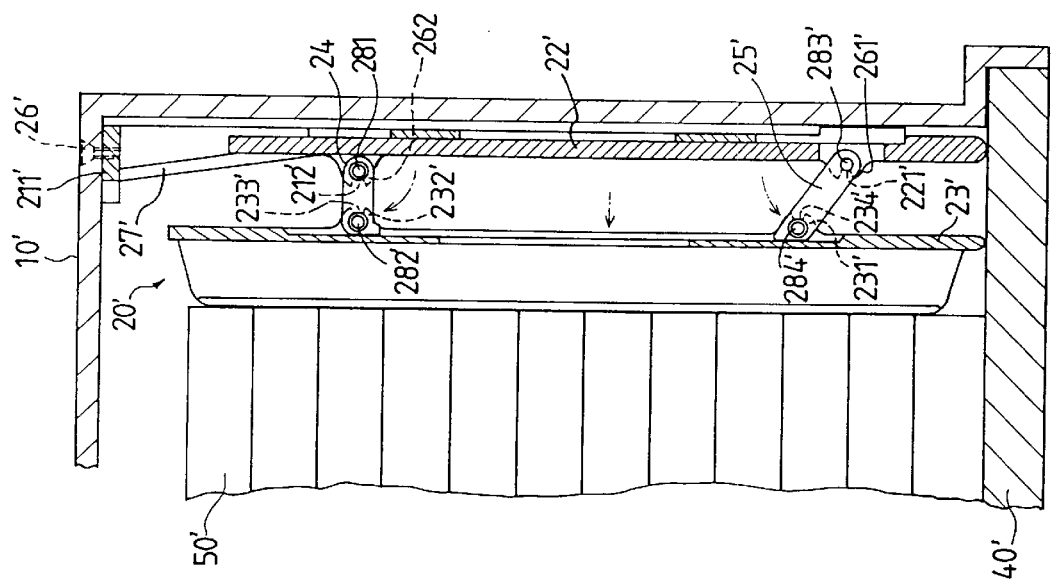
FIG. 5B is a schematic view illustrating operations of the retaining mechanism according to another embodiment of the present invention, such that the sliding rod and the front rod both urge against the chassis causing the front link to fully expand for urging the wafers to align in place, wherein the upper portion of the base rod, the lower portion of the sliding rod, and the upper and lower portions of the front link are provided with tongues having engaging sections, so as to be speedily engaged or disengaged with the pins provided at the upper and lower links.

As shown in FIG. 4, another embodiment of the wafer retaining mechanism of the present invention, the link unit 20' is disposed inside the canopy 10' and located at least at one side of the canopy 10', comprises a base rod 21' of which the right side is fixed substantially to the center of the canopy 10', a sliding rod 22' movable upwards and downwards inside the base rod 21', an upper link 24' provided at both ends pins with 281' and 282', a lower link 25' having at both ends pins 283' and 284', and a front link 23' pivoting respectively at the upper and lower portions thereof with the upper link 24' and the lower link 25'. The base rod 21' is attached to the canopy 10' by means of screws 26 threading to the canopy 10' through an extension 211' horizontally provided at the top of the base rod 21', where the base rod 21' is reinforced by a rib 27'. The base rod 21' is provided at left upper side with a tongue 262' having an engaging opening with notch 212'. The sliding rod 22' is provided at left lower side with a tongue 262' having an engaging opening with notch 221'. The front link 23' is provided at right upper and lower sides with tongues 232' and 231' respectively having engaging openings with notches 233' and 234'. Accordingly, the pins 281' and 282' of the upper link 24' are pivotally received in the holes with notches 221' and 234' of the tongues 261' and 231'. The front link 23' extends uniformly from the left and right edges thereof an urging lug 235' of appropriate dimension for pressing on the wafers.

It should be noted that the aforementioned embodiments are not intended to limit the scope of the present invention. Various changes and implementations with respect to the present invention are all contemplated by the scope of the present invention. The scope of the present invention is within the scope defined in the appended claims.

What is claimed is:

1. An improved wafer retaining mechanism, comprising:
   a canopy being a hollow lid for receiving a wafer cassette for storing a plurality of wafers, said wafer cassette being affix ed with a chassis at bottom thereof; and
   at least a link unit disposed at an appropriate location inside said canopy, said link unit comprising a sliding rod, a lower link, a front link, an upper link, and associated pins, wherein said sliding rod is slidably assembled to said canopy, said upper and lower links pivoting on said pivot link by said pins to jointly form said link unit, said front link being activated by a movement of said sliding rod to an expanded or a retracted position, whereby when said canopy receives said wafer cassette, said sliding rod urges against said chassis subjecting said front link to reach said expanded position for urging said wafers stored within said wafer cassette to align in place;
   characterized in that:
   said link unit is featured with engaging sections, for engaging said associated pins at appropriate locations of respective pivots, to facilitate assembly or disassembly of said components of said link unit.

2. The improved retaining mechanism as set forth in claim 1, wherein said engaging sections are notches having gaps smaller than the axle diameters of associated pins.

3. The improved retaining mechanism as set forth in claim 2, further comprising at least a base rod affixed to an appropriate location inside said canopy for receiving said sliding rod to slide therein.

4. The improved retaining mechanism as set forth in claim 3, wherein said base rod is provided with a limit portion and said sliding rod has an upper end being formed with a smaller diameter for receiving a spring which urges against said limit portion to generate a pushing force against said sliding rod.

5. The improved retaining mechanism as set forth in claim 3, wherein said upper link is mounted with an urging plate at an appropriate location for urging against said base rod when the front link is fully expanded so as to facilitate the front link urging against said wafers.

6. The improved retaining mechanism as set forth in claim 1, wherein said front link is equipped with a disposable liner so as to facilitate replacement of contaminated liners.

7. The improved retaining mechanism as set forth in claim 2, further comprises base rods each provided at the adjacent corners of the canopy, and sliding rods each provided in the base rod for sliding inside the base rod.

8. The improved retaining mechanism as set forth in claim 2, further comprises a base rod of which the right side is fixed substantially to the center of the canopy, and a sliding rod provided in the base rod for sliding inside the base rod.

9. The improved retaining mechanism as set forth in claim 8, wherein the base rod is at the top thereof provided horizontally with an extension which is secured to the canopy.

10. The improved retaining mechanism as set forth in claim 1, further comprising an urging lug of appropriate dimension for pressing on the wafers, said urging lug extending from the left and right edges of the front link.

11. The improved retaining mechanism as set forth in claim 2, wherein the upper and lower links are integrated with the associated pins.

* * * * *